United States Patent [19]

Meisner et al.

[11] Patent Number: 4,841,493

[45] Date of Patent: Jun. 20, 1989

[54] ELECTRONIC ACOUSTIC SIGNAL EMITTER

[75] Inventors: Alfred Meisner, Nuremberg; Erwin Potthof, Rothenbach; Henry Fluhrer, Nuremberg, all of Fed. Rep. of Germany

[73] Assignee: Diehl GmbH & Co., Fed. Rep. of Germany

[21] Appl. No.: 184,016

[22] Filed: Apr. 20, 1988

[30] Foreign Application Priority Data

May 27, 1987 [DE] Fed. Rep. of Germany ....... 3718018

[51] Int. Cl.[4] ........................................ H01L 41/08

[52] U.S. Cl. ................................ 367/140; 310/322

[58] Field of Search ............... 310/322, 328, 334, 348, 310/349, 351, 323; 367/157, 160, 161, 163, 165, 180, 140

[56] References Cited

U.S. PATENT DOCUMENTS

| | | | |
|---|---|---|---|
| 3,873,866 | 3/1975 | Goble | 310/335 |
| 4,122,365 | 10/1978 | Stephens | 310/324 |
| 4,375,041 | 2/1983 | Aizawa et al. | 310/348 |
| 4,471,259 | 9/1984 | Stoermer et al. | 310/348 |
| 4,630,342 | 12/1986 | Tichy | 310/322 |
| 4,641,054 | 2/1987 | Takahata et al. | 310/322 X |
| 4,746,905 | 5/1988 | Harima et al. | 310/348 X |

*Primary Examiner*—Brian S. Steinberger
*Attorney, Agent, or Firm*—Scully, Scott, Murphy & Presser

[57] ABSTRACT

An electronic acoustic signal emitter which includes a piezo-ceramic plate on a metal membrane, and with a circuit board which supports the electronic components. A ring-shaped conductive path with a diameter which is generally as equally large as the metal membrane is arranged on the circuit board in addition to the conductive paths for the components and is electrically connected therewith, which serves as a conductive path and carrier for the metal membrane.

9 Claims, 1 Drawing Sheet

ELECTRONIC ACOUSTIC SIGNAL EMITTER

BACKGROUND OF THE INVENTION

1. Field of the Invention

The present invention relates to an electronic acoustic signal emitter which includes a piezo-ceramic plate on a metal membrane, and with a circuit board which supports the electronic components.

2. Discussion of the Prior Art

Signal emitters of this type have become known; for example, from the disclosure of German Laid-Open Patent Appln. No. 27 02 381. In that particular instance, there is provided a piezo-electric signal emitter or transmitter, in which a circuit board is arranged within a housing, and wherein the electronic components are located on the circuit board. Furthermore, a plurality of support elements are provided on this circuit board, which carry a metal membrane and a piezo-ceramic plate adhesively fastened to the latter. Extending from the electrically conductive paths on the circuit board are two wires which provide the contacting of the metal membrane and piezo-ceramic plate.

Moreover, from the disclosure of German Petty Patent No. 79 20 782 there has become known a piezo-electric signal emitter, in which the piezo-ceramic plate is adhesively fastened onto a support plate, and the lastmentioned is arranged within a housing. The terminals or connecting wires of the metal membrane and of the piezo-ceramic plate are electrically connected to a deformation in the housing. In that location there are provided contact pins, which represent a connection to the electronic components. The above-mentioned housing of the signal emitter possesses a central opening and, in cooperation with the metal membrane, acts as a Helmholtz resonator.

SUMMARY OF THE INVENTION

In contrast with the above-mentioned state-of-the-art, it is an object of the invention to provide an electronic acoustic signal emitter or transmitter which can be assembled in a simple manner and which possesses a less expensive structure.

In order to attain the foregoing object, pursuant to the invention it is proposed that the metal membrane is conductively fastened on the circuit board, whereby the circuit board possesses a radiation opening below the metal membrane.

In a preferred modification of the invention, it is contemplated that a ring-shaped conductive path with a diameter which is generally as equally large as the metal membrane is arranged on the circuit board in addition to the conductive paths for the components and is electrically connected therewith, which serves as a conductive path and carrier for the metal membrane.

Essential to the invention is the circuit board on which the metal membrane is applied directly whereby, within the context of the invention, it is important that the metal membrane is electrically conductively fastened on the circuit board. This is effectuated through a ring-shaped conductive path which is conductively connected with the conductive paths on the circuit board; however, on the other side, represents a conductive contact with the metal membrane. The fastening of the metal membrane on the ring-shaped conductive path can be implemented through soldering or through adhesion by means of an electrically conductive adhesive. A further important feature of the invention can be ascertained in that the circuit board itself represents a component of the acoustic sound body, and due to its action as a resonance body leads to an amplification in the sound intensity and to an attenuation in the radiation frequency.

Pursuant to a further preferred embodiment of the invention, it is contemplated that all components of the actuating circuit for the signal emitter, as well as the metal membrane are arranged on one side of the circuit board, and wherein the circuit board is automatically equipped and soldered with the components and the metal membrane pursuant to the SMD-method.

On the basis of the above-mentioned features there is achieved that the inventive signal emitter can be easily assembled and inexpensive in the production thereof, as well as, additionally thereto, possessing an extremely advantageous radiating behavior with respect to the sound intensity as well as with regard to the frequency range.

A problem which is encountered during the production and in the determination of the acoustic behavior of a piezo-electric signal emitter are the differing coefficients of thermal expansion of the metal membrane and of the piezo-ceramic plate. The heretofore employed adhesives were required to compensate for the different degrees of expansion of the two materials. For utilizations of the signal emitter at temperatures encountered in the surroundings of up to 125° C.; for example, as would be the case for kitchen range timers, the usual adhesives are no longer adequate to fulfill the above-mentioned task. It has now been ascertained that metal alloys possessing the same coefficients of thermal expansion as the piezo-ceramic plate are well suited for the above-mentioned purpose, inasmuch as the adhesive is no longer loaded or stressed to such a considerable measure. Suitable as metal alloys, which are adapted for the above-mentioned purpose, there have been found such which are constituted of 28% nickel, 18% cobalt, with the remainder iron; or of 42% nickel with the remainder being iron.

BRIEF DESCRIPTION OF THE DRAWINGS

Reference may now be had to the following detailed description of two exemplary embodiments of the invention, taken in conjunction with the accompanying drawings; in which.

DETAILED DESCRIPTION

Figure 1:
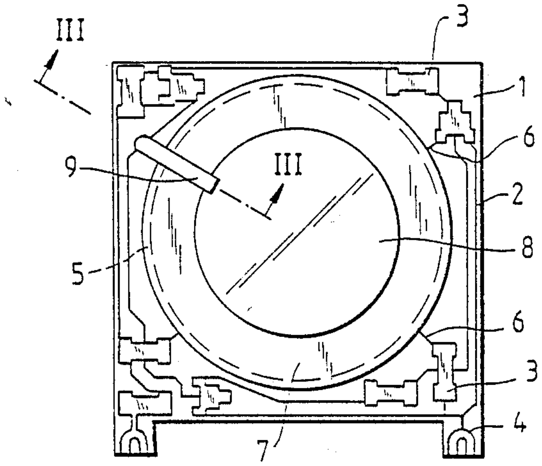
FIG. 1 illustrates a plan view of the inventive signal emitter pursuant to a first embodiment.
Figure 2:
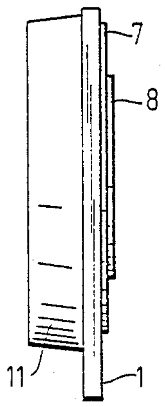
FIG. 2 illustrates a side view of the signal emitter.

In FIG. 1 of the drawings there is illustrated a circuit board 1 on which there are applied electrically conductive paths 2 and electronic components 3 for the actuating circuit of the signal emitter or transmitter. The conductive paths extend into terminal lugs 4 through the intermediary of which there is implemented the supplying of current to the actuating circuit. Reference numeral 5 identifies a ring-shaped conductive path which stands in electrical connection with the electrical components through a conductive path 6. Electrically-conductively fastened on this ring-shaped conductive path 5 is a metal membrane 7, to which metal membrane, in turn, there is adhered a piezo-ceramic plate 8. The electrical connection between the piezo ceramic plate 8 and the circuit board is provided through a metallic strip 9 which is soldered on the ceramic plate as well as on a conductive path.

On the circuit board 1, on which there are initially applied the conductive paths 2 and 5 in a usual manner, in an SDM-process it is automatically equipped with the components and the metal membrane, onto which the piezo-ceramic plate 8 is already adhesively fastened. Through the arrangement of the components and the metal membrane on the same side of the circuit board, this automatic equipping is rendered extremely easy. In a subsequent process step, the components and the metal membrane are then soldered.

Figure 3:
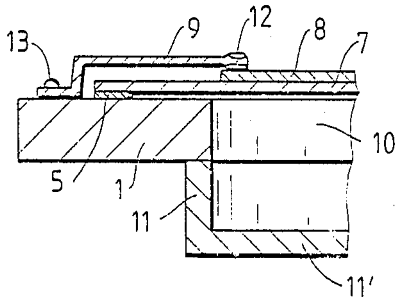
FIG. 3 illustrates a fragmentary sectional view through the signal emitter taken along line III—III in FIG. 1, shown on an enlarged scale.

From FIG. 3 there can be ascertained that the circuit board 1 possesses an opening 10 beneath the metal membrane 7, through which there is radiated the sound of the metal membrane. Inorder to amplify the radiation energy, the housing of a Helmholtz resonator 11 is located below the circuit board. This resonator, not shown in the drawing, possesses in the wall 11' of its housing a small radiation aperture, whose diameter is substantially smaller than that of the opening 10 in the circuit board.

Whereas the piezo-ceramic plate 8, which is metallized on its surface, possesses an electrical connection through the metal membrane 7 and the ring-shaped conductive path 5 with the circuit board 1, the second side thereof is connected through the metal strips 9 which is fastened with one soldering point 12 to the plate 8 and with one soldering point 13 to the circuit board, with the other potential on the circuit board 1.

It can be recognized from FIG. 3 that through the fastening of the metal membrane 7 on the circuit board 1, the acoustic energy of the metal membrane is not only transmitted through the opening 10, but also across the circuit board 1 itself. Because of its size, the circuit board represents a significant resonance or sounding board for the signal emitter. Through this spatial expanse there is also significantly attenuated the radiation frequency of the signal generator, which is extremely desirable for piezo-electric signal emitters possessing a relatively high radiation frequency.

As already mentioned, the connection between the metal membrane 7 and the ring-shaped conductive path 5 can be implemented not only through soldering, but also through adhesion by means of an electrically conductive adhesive. However, within the context or scope of the invention it is also possible to utilize a non-conductive adhesive, and to produce the electrically conductive connection either through metal particles which are dispersed throughout the adhesive or through a separate connecting wire (for example, metal strips).

Figure 4:
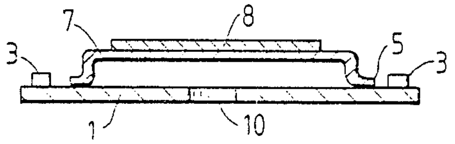
FIG. 4 illustrates a sectional view through a signal emitter which is constructed pursuant to a second exemplary embodiment of the invention.

In FIG. 4 of the drawings, there is illustrated a second exemplary embodiment of a signal emitter or transmitter which, in contrast with the first embodiment, there is obtained a still further reduction in the cost of production through the elimination of the Helmholtz resonator while maintaining about the same tone quality and power. In this instance, the membrane 7 is not formed plate-shaped, but is in a cup-shape, and the radiation opening 10 in the circuit board 1 is of a smaller diameter than in the case of the first exemplary embodiment, so as to provide a hollow chamber with similar resonance behavior as would be with a Helmholtz resonator.

What is claimed is:

1. An electronic acoustic signal emitter including a piezo-ceramic plate arranged on a metal membrane; and a circuit board supporting an actuating circuit comprising of electrical components, said electrical components of said actuating circuit connected by conductive paths on said circuit board, said electrical components of said actuating circuit electrically connected to a ring shaped conductive path on said circuit board of diameter generally equal to that of the metal membrane, said ring shaped conductive path forming a support for said metal membrane, the side of said metal membrane opposite said piezo-ceramic plate being electrically conductively fastened to said circuit board at said ring shaped conductive path and concentric thereto, said electrical components and said metal membrane located on one side of said circuit board, and said circuit board including a radiation opening located beneath said metal membrane.

2. A signal emitter as in claim 1, wherein said electrical components are connected to said conductive paths on said circuit board and said metal membrane is electrically conductively fastened to said circuit board by the solder deposits of a surface mounted device-process.

3. A signal emitter as claimed in claim 1, wherein the side of the piezo-ceramic plate distant from the metal membrane is connected through a metal strip with a conductive path on the circuit board.

4. A signal emitter as claimed in claim 1, wherein the metal membrane is adhesively fastened to the circuit board.

5. A signal generator as claimed in claim 1, wherein a Helmholtz resonator is arranged on the side of the radiation opening in the circuit board distant from the metal membrane.

6. A signal emitter as claimed in claim 1, wherein the metal membrane is cup-shaped to form a resonance chamber on one side of the circuit board, and wherein the circuit board possesses a radiation opening.

7. A signal emitter as in claim 1, said metal membrane comprised of a metal alloy having substantially the same coefficients of thermal expansion as the piezo-ceramic plate for the signal emitter.

8. A signal emitter as in claim 7, wherein said alloy is comprised of 28% Ni, 18% Co, and the remainder Fe.

9. A signal emitter as in claim 7, wherein said alloy is comprised of 42% Ni, and the remainder Fe.

* * * * *